US008429470B2

(12) United States Patent
Shore

(10) Patent No.: US 8,429,470 B2
(45) Date of Patent: Apr. 23, 2013

(54) MEMORY DEVICES, TESTING SYSTEMS AND METHODS

(75) Inventor: Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 402 days.

(21) Appl. No.: 12/721,346

(22) Filed: Mar. 10, 2010

(65) Prior Publication Data

US 2011/0225471 A1    Sep. 15, 2011

(51) Int. Cl.
  *G11C 29/00*    (2006.01)
(52) U.S. Cl.
  USPC .......................................... 714/719
(58) Field of Classification Search ............. 714/719
  See application file for complete search history.

(56) References Cited

U.S. PATENT DOCUMENTS

| 7,249,296 | B2 * | 7/2007 | Hirabayashi | 714/718 |
|---|---|---|---|---|
| 2004/0042312 | A1 * | 3/2004 | Kim et al. | 365/222 |
| 2006/0256637 | A1 * | 11/2006 | Takahashi et al. | 365/222 |
| 2008/0046788 | A1 * | 2/2008 | Lee et al. | 714/718 |
| 2009/0083592 | A1 * | 3/2009 | Tanaka et al. | 714/718 |
| 2009/0167377 | A1 * | 7/2009 | Takano | 327/143 |
| 2009/0204739 | A1 * | 8/2009 | Gronlund | 710/262 |
| 2009/0327800 | A1 * | 12/2009 | Kim | 714/5 |
| 2010/0042878 | A1 * | 2/2010 | Kanasugi | 714/718 |
| 2010/0058126 | A1 * | 3/2010 | Chang et al. | 714/718 |

OTHER PUBLICATIONS

Author: Karim; Title: Protected Storage-Write Mask to Protect a Region of Memory from Processor Writes; Publisher: IBM (TDB v36 n8 Aug. 1993 p. 635-636).*

* cited by examiner

*Primary Examiner* — Ajay Bhatia
*Assistant Examiner* — Thien D Nguyen
(74) *Attorney, Agent, or Firm* — Dorsey & Whitney LLP

(57) ABSTRACT

Testing systems and methods, as well as memory devices using such testing systems and methods, may facilitate testing of memory devices using a read-modify-write test procedure. One such testing system receives a signal indicative of at least some of a plurality of bits of data read from an address differing from each other, and then masks subsequent write operations at the same address. Therefore, any address at which the bits of read data do not all have the same value may be considered to be faulty. Failure data from the test can therefore be stored in the same array of memory cells that is being tested.

28 Claims, 4 Drawing Sheets

US 8,429,470 B2

MEMORY DEVICES, TESTING SYSTEMS AND METHODS

TECHNICAL FIELD

Embodiments of this invention relate to memory devices, and, more particularly to memory devices having on-board test capabilities as well as testing methods and systems.

BACKGROUND

During the fabrication of integrated circuits such as memory devices, it is conventional to test such integrated circuits at several stages during the fabrication process. For example, after fabrication, integrated circuits may be connected to a tester with a probe card when the integrated circuits are still in wafer form. In a final test occurring after the integrated circuits have been diced from the wafer and packaged, the integrated circuits may be placed into sockets on a load board or other device and once again tested.

As is well-known in the art, memory devices may be provided with circuitry that allows limited repair of defects in the memory devices. Such repair devices may allow defects to be repaired at specific addresses. Once the addresses that include a defect have been determined (i.e., once the address at which respective defects are located have been obtained by testing), the defects may then be repaired.

Memory devices are conventionally tested during fabrication and after packaging using high-speed automated testers. The testers typically having a single data input/output ("I/O") bus, which is normally coupled to several memory devices during a test. Although data may be simultaneously written to all of the memory devices, data may not be simultaneously read from all of the memory devices or else several memory devices may simultaneously apply read data to the I/O bus of the tester. To avoid this bus contention problem, data may be read from each of the memory devices in sequence, thereby requiring multiple read cycles to read the data from all of the memory devices. Further, conventional testers for memory devices are very expensive, and using a separate tester to test each memory device individually would require a very large number of testers in a high volume memory device fabrication environment. To limit the cost of memory device testing, memory testers may test a large number of devices in parallel. In these situations, a tester may transmit write commands, addresses and data to a large number of memory devices in parallel, thus writing the same data to the same locations in all of the memory devices. The memory devices may then read to determine if the read data matches the write data. If the data read at any address does not match the data written to that address, then a defect at that address is considered to exist.

One problem with testing memory devices using the above-described techniques is that it may be necessary to read data from each memory device individually to determine if data read from each address is in error. Doing so can greatly limit the rate at which a tester can test memory devices. As a result, attempts have been made to provide memory devices with limited on-board test capabilities. One approach has been to provide comparison circuitry in the memory device itself to avoid the need to couple read data from the memory device for evaluation. A large number of memory devices may be coupled to a tester in parallel. The tester may simultaneously write data to each address in all of the memory devices, and the memory device subsequently compares the data written to each address with the data read from that address. In another approach, bits of the data read responsive to a memory request may be compared to each other to detect and error, or the correct comparison bits may be supplied to the memory devices by the tester with the read commands. In any case, a bit indicative of an error can be stored in an on-board storage device, such as a latch. Address bits corresponding to the location of the defect causing the error can also be stored in an on-board storage device. The on-board storage devices can then be read at the conclusion of the test to determine the addresses where errors have been detected, and those addresses can then be repaired by conventional means. Unfortunately, it can require a significant number of storage devices, such as latches, to store all of the address bits for each of a large number of addresses that are to be repaired by conventional means. As a result, the storage capacity and/or cost of memory devices can be adversely affected by the need to provide a large amount of circuitry to store error data.

DETAILED DESCRIPTION

Figure 1:
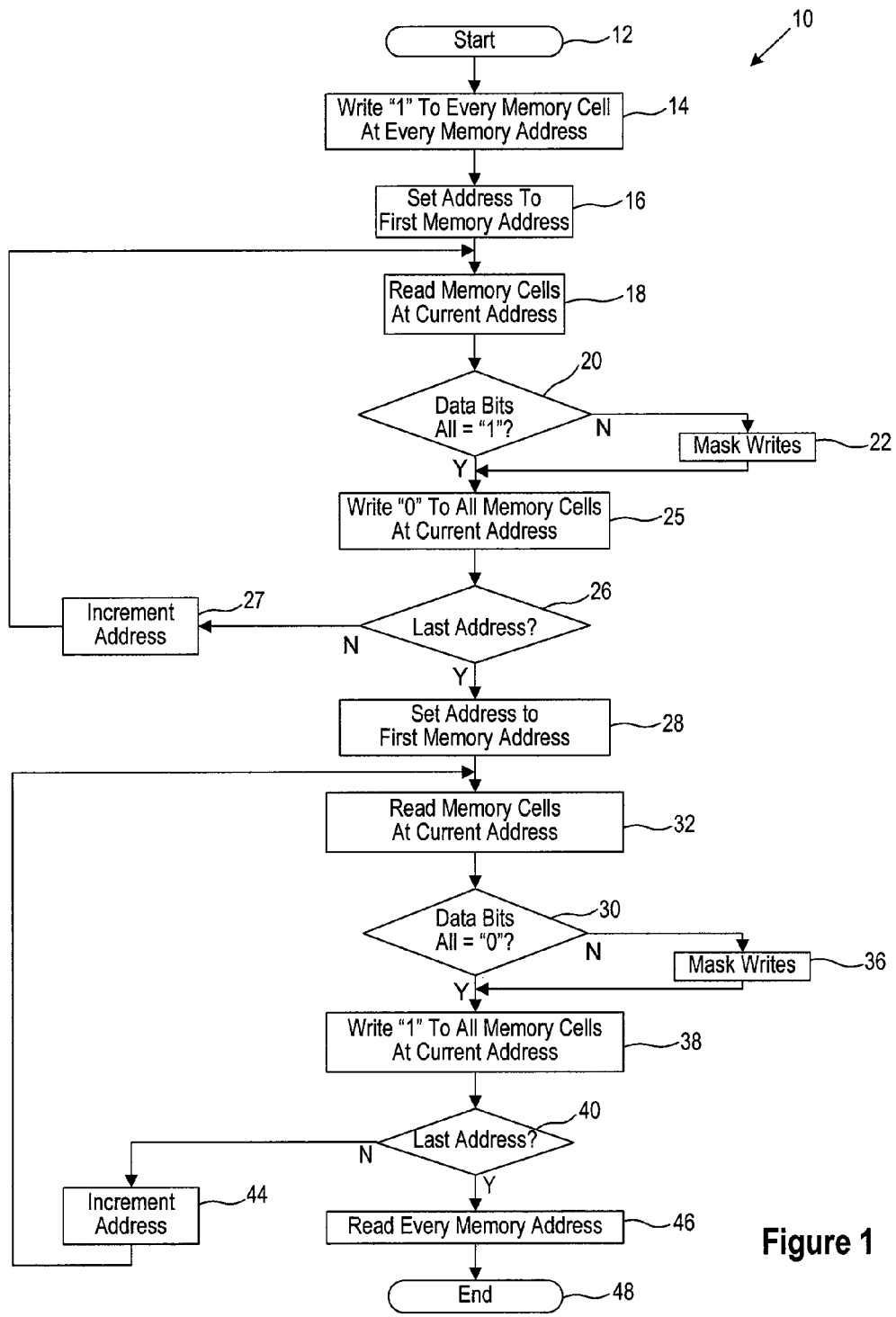
FIG. 1 is a flowchart showing a read-modify-write test procedure according to one embodiment.

Various embodiments of memory device testing systems and methods may be used by performing a standard "read-modify-write" test procedure. One example of a suitable read-modify-write procedure 10 is illustrated in FIG. 1. The test starts at 12, and specific data, such as a logic "1" bit, may be written to every memory cell of every memory address in an array at step 14. The number of memory cells at each address may vary from one memory device to another, but it commonly corresponds to a number of data bus terminals or the product of the number of data bus terminals and a number of serial bits that are coupled to or from each data bus terminal for each write or read access. An internal address counter (not shown) may then be set to the address of a first memory cell at step 16. A read memory operation may then be initiated at the current address at step 18. A determination may then be made at step 20 whether all of the read data bits are a "1." If not, a write mask signal may be generated at step 22 to preserve the failing state of the data that would otherwise be written to at the current address, as explained below. If it was determined at step 20 that all of the read data bits were a "1," the write mask signal is not generated at step 22 so that a "0" may be written to all memory cells currently being addressed at step 25. The process may then advance to step 26 as explained below. If the memory cells being read correctly store the data (e.g., the cells store the specific data without error), the read data bits will all be "1." A check is then made at step 26 to determine if the read at step 18 was at the last address in the memory device. If not, the address is incremented at step 27, and the process again progresses through steps 18-26 as exampled above.

If the determination is made at step 26 that the last address was read, the current address may be set to the first memory address at step 28. Therefore, if the 4 bits read at step 18 were found to be "1111" at step 20, then the data stored at the current address will now be "0000." The memory cells at the current address may again be read at step 32. A logic "0" should normally be read from each of the non-failing memory cells being addressed at step 32 because a "0" was written to all of the non-failing memory cells at step 25. A determination may be made at step 30 whether all of the read data bits are a "0." If a "1" is read from any of the memory cells being addressed in step 30, a write mask signal may be generated at step 36 to preserve the failing state of the data that would otherwise be written to at the current address, as explained below. If it was determined at 30 that all of the read data bits were a "0," the write mask signal is not generated at step 36 so that a "1" may be written to all memory cells currently being addressed at step 38. The process may advance to step 40 without the memory address being masked since there may be no additional writes at the current address that may require masking. On the other hand, if all of the read data bits are read as a "0" at step 30, a "1" may be written to all memory cells currently being addressed at step 38. On the other hand, for example, if "1101" was read at an address at step 30, then the data stored at the current address will continue to be "1101." Thus, if the incorrect data was read at either step 18 or 28, the data bits stored at the corresponding address should be a combination of "1" and "0" bits. On the other hand, if the correct data was read at both step 18 and step 28, the data bits stored at the corresponding address should be "1111" after step 38 has been completed. A determination may then be made at step 40 whether the memory cells being addressed is the last memory address in the array. If not, the address may be incremented at step 44 before returning to step 32 where the memory cell corresponding to the new address may be read. The above procedure again repeats until a determination is made at step 40 that the memory cells currently being addressed are the last memory cells in the array. After the above procedure has been completed for all memory cells in the array, the entire array may be read at step 46, and the process may then terminate at step 48. Any address that contains any "0" bit may be considered an address that may include a defect, and that should be repaired by suitable means, such as by remapping the address to a redundant row or column of memory cells. Although the particular bit that is storing a "0" may identify a specific defective memory cell at that address, the identity of the specific defective memory cell may not be required since memory cell defects may generally be repaired on an address-by-address basis rather than a cell-by-cell basis.

It can therefore be seen that, at the conclusion of the test, all of the test failure data from the test may be stored in the very same array that was tested by the read-modify-write test procedure. There may be thus no limit to the amount of test failure data that can be stored, and no additional storage components, such as latches, may be required to store this failure data. In contrast, as mentioned above, prior art memory device would trigger a latch or other device at steps 22 and 36 to store the address that resulted in the incorrect data being read. Unfortunately, the amount of space consumed on a semiconductor die by the number of latches needed to store all of the data bits of each address or even each address may preclude a large number of addresses that include a defect from being stored. As a result, prior art read-modify-write test procedures may sometimes be inadequate.

Figure 2:
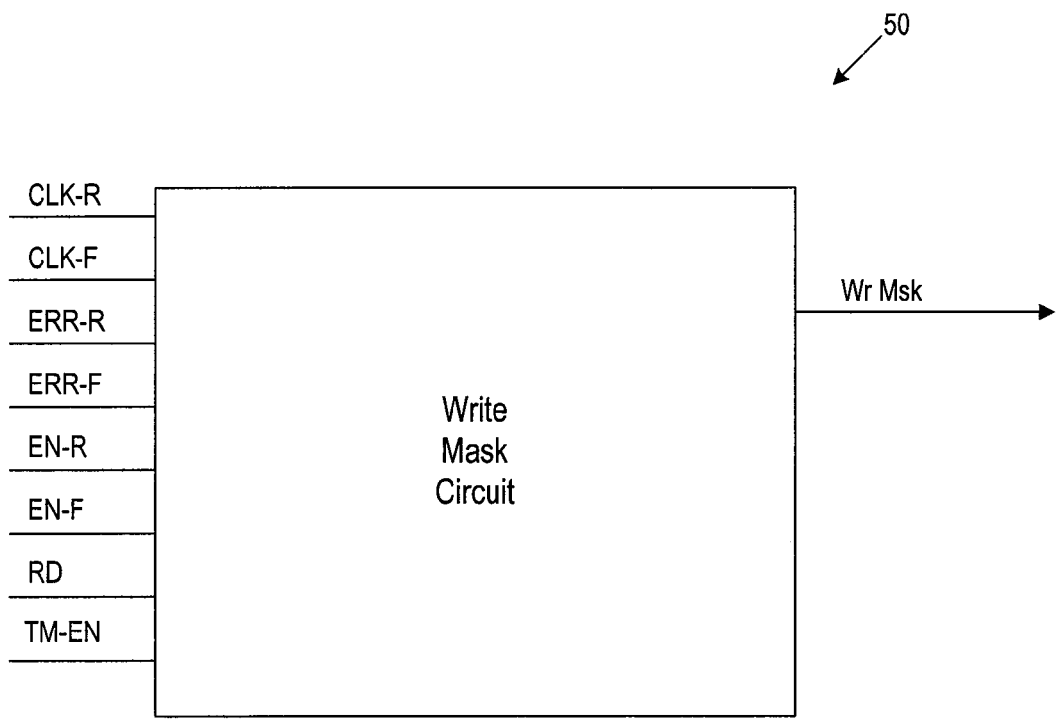
FIG. 2 is a block diagram of a write mask system according to one embodiment.

One embodiment of a system 50 for providing write mask signals responsive to detecting a read data error is shown in FIG. 2. With reference to FIG. 2, the system 50 may receive an active high TM-EN signal, which transitions high during the "read-modify-write" test procedure to enable failure data to be stored in the array of memory cells being tested. Thereafter, active high CLK-R and CLK-F signals, which are generally available in conventional memory devices, may be applied to the system 50. The CLK-R and CLK-F signals are clock signals that may transition high each time a comparison is made in the memory device between data written to a memory address during respective rising and falling edges of a write data strobe signal, and corresponding data may be subsequently read from that same address. The system 50 may also receive active high ERR-R and ERR-F signals, which are also signals that are available in conventional memory devices to indicate when at least one of a set of data bits read at respective rising and falling edges of an internal clock signal is in error. The system 50 may also receive active high EN-R and EN-F signals available in conventional memory devices to indicate when respective rising edge and falling edge read data has been evaluated by circuitry in the memory device to determine if the read data are in error. Finally, the system 50 may receive the active high RD signal, which may also be available in conventional memory devices to indicate the start of a memory read operation.

In operation, the TM-EN signal may be set high to enable failure data to be stored in the memory array being tested using a "read-modify-write" test procedure, such as the test procedure shown in FIG. 1. A logic "1" data bit may then be written to all of the memory cells at each memory address of the memory array, as explained above with respect to step 14 of FIG. 1. Thereafter, the RD signal may transition high, and data may be read from the memory cells at the first address of the memory array being tested during either the rising edge or the falling edge of the internal clock signal. When either the EN-R or the EN-F signal, respectively, transitions high, if any of the data bits read at step 18 (FIG. 1) was a low, the ERR-R or ERR-F signal will be active high. In such case, the WrMsk signal at the output of the system 50 may transition high on the rising edge of either the CLK-R or the CLK-F signal, respectively. The active high WrMsk signal may be applied to conventional circuitry commonly found in conventional memory devices to mask data from being written to the memory array being tested for as long as the WrMsk signal is high. Therefore, the writing of a logic "0" to the memory cell being tested at step 26 may be suppressed. The system 50 may operate in essentially the same manner when the data bits are read at step 28 (FIG. 1) and data bits may be written at step 38 unless the write was masked at step 36.

Although the embodiment exemplified by the system 50 uses a specific set of signals providing specific functions to cause failure data to be stored in the array being tested, it will be understood that other embodiments may use a fewer or greater number of other signals providing the same or different functions to cause failure data to be stored in the array being tested.

Figure 3:
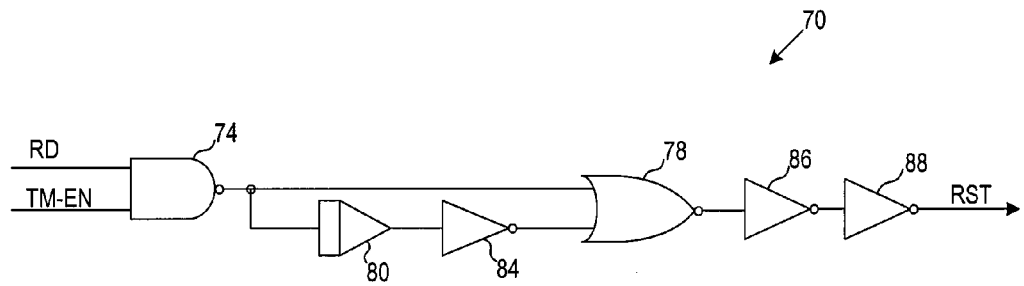
FIG. 3 is a logic diagram of a portion of a write mask circuit according to another embodiment.
Figure 4:
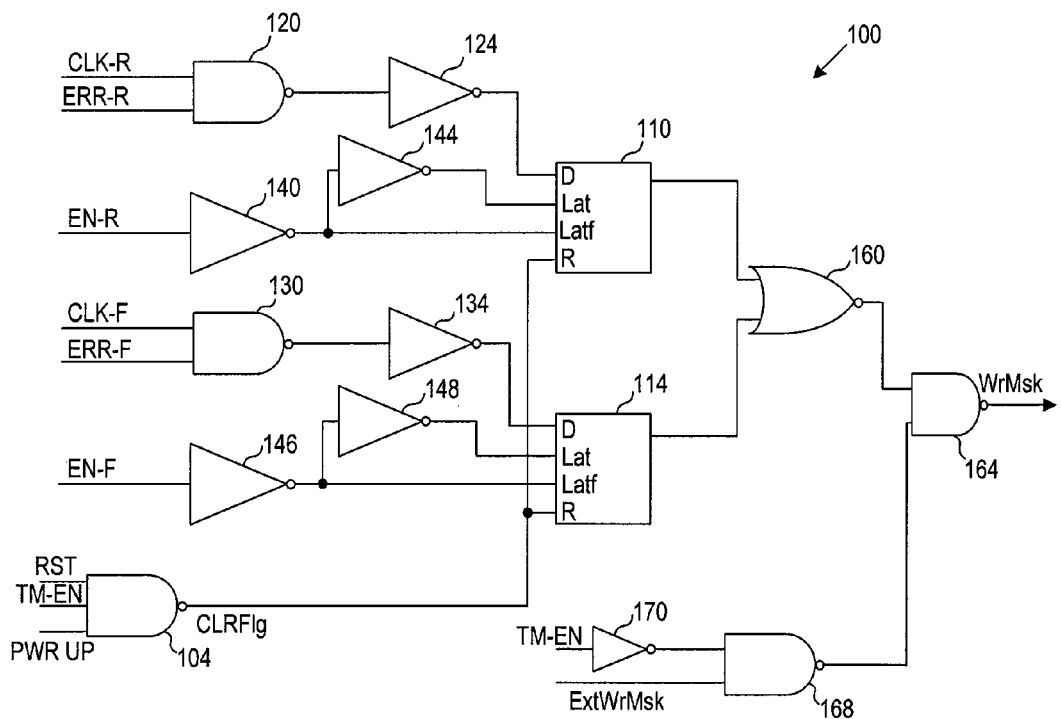
FIG. 4 is a block diagram of the remaining portion of the write mask circuit embodiment of FIG. 3.

An embodiment of the system 50 of FIG. 2 for providing write mask signals is shown in FIGS. 3 and 4. With reference to FIG. 3, a one-shot circuit 70 includes a NAND gate 74 that receives the RD signal and the TM-EN signal. As explained above, the TM-EN signal may transition to enable the above-described test procedure. The RD signal may transition high at the start of a read operation when data may be read from a current address. Thus, when the test mode is enabled, the output of the NAND gate 74 may transition low. This low may be applied directly to one input of a NOR gate 78 and to the other input of the NOR gate 78 through a delay circuit 80 and an inverter 84. Before the RD signal has transitioned high at the start of a read operation, the output of the NAND gate 74 may be high so that the output of the inverter 84 will be low. The output of the inverter 84 may remain low for a period because of the delay circuit 80 when the output of the NAND 74 transitions low at the start of a read operation. As a result, the output of the NOR gate 78 may transition high for a period determined by the delay of the delay circuit 80. The output of the NOR gate 78 may be coupled through two inverters 86, 88 to generate a reset ("RST") signal. Thus, the RST signal may pulse high at the start of every read operation.

The RST pulse from the one-shot 70 may be applied to a write mask circuit 100, which is shown in FIG. 4. More specifically, the RST pulse may be applied to one input of a NAND gate 104, which also has inputs receiving the TM-EN signal and a PWRUP signal whenever a supply voltage in the memory device has stabilized. The output of the NAND gate 104 may generate an active low clear flag ("CLRFlg") signal. Therefore, the CLRFlg signal may pulse low responsive to the RST pulse whenever the test mode is enabled and the supply voltage has stabilized.

With further reference to FIG. 4, the write mask circuit 100 may include a pair of latches 110, 114 each of which has a data ("D") input. The D input of the latch 110 may be coupled to the output of a NAND gate 120 through an inverter 124. One input of the NAND gate 120 may receive the CLK-R signal while the other input of the NAND gate 120 may receive the ERR-R signal. As explained above with reference to FIG. 2, the CLK-R signal is a clock signal that transitions high each time a comparison is made in the memory device between data written to a memory address during a rising edge of a write data strobe signal, and corresponding data may be subsequently read from that same address. As also explained above, the ERR-R is a signal available in conventional memory devices to indicate when at least one of the data bits read responsive to the rising edge of an internal clock signal is in error. Thus, if the data being read from a memory array responsive to the rising edge of an internal clock signal at an address contains an erroneous data bit, the D input of the latch 110 will transition high at the rising edge of the CLK-R signal.

The D input of the latch 114 may be coupled to circuitry that is identical to the circuitry to which the D input of the latch 110 is coupled. Specifically, the D input may be coupled to a NAND gate 130 through an inverter 134, the inputs of the NAND gate 130 receive the CLK-F signal and the ERR-F signal. Therefore, if the data being read from a memory array responsive to the falling edge of an internal clock signal at an address contains an erroneous data bit, the D input of the latch 110 will transition high at the rising edge of the CLK-F signal.

Each of the latches 110, 114 also includes an active high latch input Lat and an active low Latf input which causes a logic level applied to a data D input to be stored in the respective latch 110, 114. The Latf input of the latch 110 may be coupled to the output of an inverter 140, and the Lat input may be coupled to the output of an inverter 144, which has an input coupled to the output of the inverter 140. The input of the inverter 140 receives the EN-R signal, which, as explained above, is a signal that is available in conventional memory devices to indicate when the data read responsive to the rising edge of an internal clock signal has been evaluated by circuitry in the memory device to determine if the read data are in error. Thus, in response to the rising edge of the EN-R signal, a logic "0" will be stored in the latch 110 if none of the bits of the read data is in error, and a logic "1" will be stored in the latch 110 if any of the bits of the read data is in error. Similarly, The Latf input of the latch 114 may be coupled to the output of an inverter 146, and the Lat input may be coupled to the output of an inverter 148, which has an input coupled to the output of the inverter 140. The input of the inverter 146 receives the EN-F signal, which, as explained above, is a signal that is available in conventional memory devices to indicate when the data read responsive to the falling edge of an internal clock signal has been evaluated by circuitry in the memory device to determine if the read data are in error. Thus, in response to the rising edge of the EN-F signal, a logic "0" may be stored in the latch 114 if none of the bits of the read data is in error, and a logic "1" may be stored in the latch 114 if any of the bits of the read data is in error.

The final input to the latches 110, 114 is an active low reset ("R") input, which may be coupled to receive the ClrFlg signal from the output of the NAND gate 104. As explained above, the CLRFlg signal may pulse low responsive to the RST pulse whenever the test mode is enabled and the supply voltage has stabilized. As also explained above, the RST pulse may be generated at the start of any memory read operation. Thus, the latches 110, 114 may be reset at the start of any memory read operation.

The outputs of the latches 110, 114 may be applied to respective inputs of a NOR gate 160. Therefore, if either latch 110, 114 is set responsive to detecting a read in error, the output of the NOR gate 160 may be low. The output of the NOR gate 160 may be applied to an input of a NAND gate 164 which receives the output on a NAND gate 168 at its other input. The NAND 168 may receive the TM-EN signal through an inverter 170 so that the NAND gate 168 is disabled to enable the NAND gate 164 whenever the test mode is enabled. The other input of the NAND gate 168 may receive an external write mask signal ("ExtWrMsk"), which is normally present in conventional memory devices whenever a write operation is to be masked. Thus, when the test mode is enabled, an active high mask write signal ("WrMsk") may be generated whenever either of the latches 110, 114 is set responsive to detecting a data read error. When the test mode is inactive, the WrMsk may be generated responsive to the ExtWrMsk signal. As explained above, the WrMsk signal is normally generated in conventional memory devices responsive to the ExtWrMsk write mask signal to mask a data write operation. However, using the write mask circuit 100, the WrMsk may also be generated whenever a read data error is detected during a test procedure, such as the read-modify-write test procedure 10 shown in FIG. 1.

Figure 5:
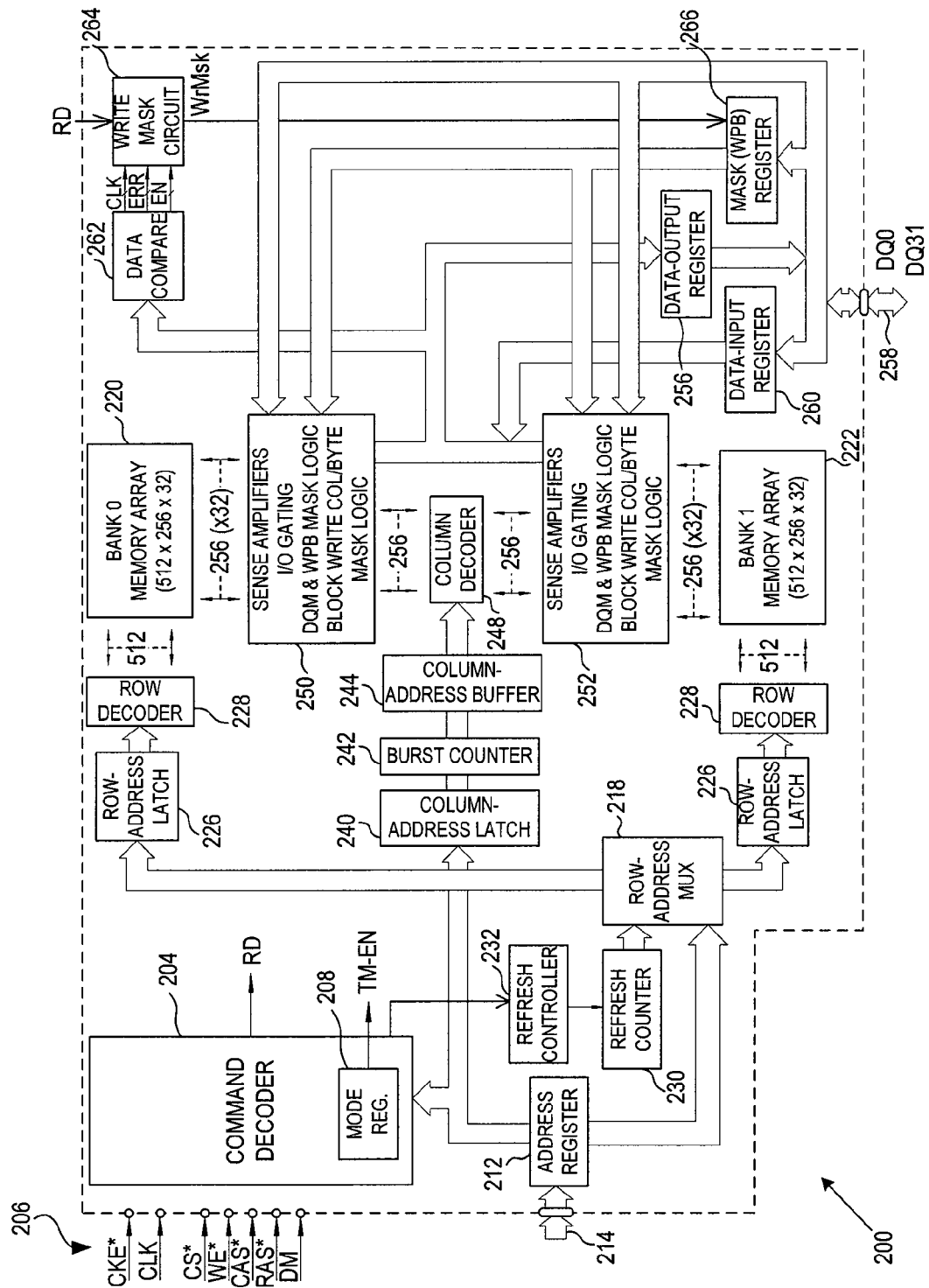
FIG. 5 is a block diagram of an embodiment of a memory device that can be used with various embodiments of a write mask circuit.

Various embodiments of the write mask circuit can be used in virtually any memory device in which a write mask operation is possible, including dynamic random access memory (DRAM") devices, flash memory devices, and static random access memory (SRAM") devices, to name a few. For example, as shown in FIG. 5, a conventional synchronous dynamic random access memory ("SDRAM") 200 may use various embodiments of a write mask circuit. The operation of the SDRAM 200 is controlled by a command decoder 204 responsive to high-level command signals received on a control bus 206. The command decoder 204 generates a sequence of command signals responsive to the high level command signals to carry out the function (e.g., a read or a write) designated by each of the high level command signals. These command signals include the RD signal, which transitions active high at the start of read operations. The command decoder 204 may also include a mode register 208 that can be programmed to generate the test mode enable TM-EN signal.

The SDRAM 200 includes an address register 212 that receives row addresses and column addresses through an address bus 214. The address bus 214 is generally coupled to a memory controller (not shown in FIG. 5). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses may be generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242, which applies a sequence of column addresses to the column address buffer 244 starting at the column address output by the address register 212. In either case, the column address buffer 244 applies a column address to a column decoder 248.

Data to be read from one of the arrays 220, 222 is coupled to column circuitry 250, 252, which may include sense amplifiers, I/O gating, DQM &WPB mask logic, block write col/byte mask logic) for one of the arrays 220, 222, respectively. The data bits developed by the sense amplifiers may then be coupled to a data output register 256. Data to be written to one of the arrays 220, 222 may be coupled from the data bus 258 through a data input register 260. The write data may be coupled to the column circuitry 250, 252 where they may be transferred to one of the arrays 220, 222, respectively. The memory device 200 also includes a data compare circuit 262 that serves as an error detect circuit by comparing sets of data bits read from the memory banks 220, 222 to determine if they all have the same logic level. If not, the data compare circuit 262 may generate ERR-R and ERR-F signals, as described above. The data compare circuit 262 may also generate the CLK-R and CLK-F signals and the EN-R and EN-F signals, which are also described above. These signals may be applied to a write mask circuit 264, which generates the WrMsk signal to mask data write operations. The WrMsk signal is applied to a mask register 266 to selectively block the flow of write data to the column circuitry 250, 252.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. A method of testing a memory device, comprising:
    writing first data to an array of memory cells in the memory device corresponding to each of a plurality of memory addresses in a first write operation;
    reading first read data from the array of memory cells in the memory device for each of the plurality of memory addresses in a first read operation;
    determining, based on the first react data, whether the first data were correctly stored in the array of memory cells corresponding to each of the plurality of memory addresses;
    writing second data, in a second write operation, to the memory cells in the memory device corresponding to each of the plurality of memory addresses that were determined to have correctly stored the first data;
    masking the second write operations to an address of the plurality of memory addresses in response to determining the address incorrectly stored the first data;
    reading second read data from the array of memory cells in the memory device corresponding to each of the plurality of memory addresses that were accessed in the second write operation;
    determining, based on the second read data, whether the second data were correctly stored in memory cells for each of the plurality of memory addresses that were accessed in the second write operation;
    writing third data, in a third write operation, to the array of memory cells in the memory device for each of the plurality of memory addresses that were determined to have correctly stored the second data; and
    reading third read data from the array of memory cells in the memory device corresponding to each of the plurality of memory addresses to determine which of the plurality of addresses may include a defect.

2. The method of claim 1 wherein the act of writing first data to an array of memory cells in the memory device for each of a plurality of memory addresses in a first write operation comprises writing a data bit having the same value to all of the memory cells at each of the plurality of memory addresses.

3. The method of claim 1, further comprising masking the third write operations to an address of the plurality of memory addresses in response to determining the address incorrectly stored the second data.

4. The method of claim 1 wherein the array of memory cells in the memory device comprises the sole storage component in the memory device providing an indication of which of the plurality of addresses may include a defect.

5. A method of testing a memory device comprising:
    writing first data to addresses in the memory device; and
    for each of the addresses in the memory device:
    reading read data stored at the address;
    determining whether the first data was correctly stored at the address based on the read data;
    masking subsequent write operations at the address in response to determining that the first data was incorrectly stored at the address;
    writing second data to the address, the writing of the second data being suppressed in response to the write operation was masked; and
    reading data from the addresses in the memory device to determine which of the addresses may include a defect.

6. The method of claim 5, further comprising, for each of the plurality of the address in the memory device to which the second data was written:
    reading second read data stored at the address;
    determining whether the second data was correctly stored at the address based on the second read data;
    masking subsequent write operations at the address in response to a determination that the second data was incorrectly stored at the address; and
    writing third data to the address, the writing of the third data being suppressed if the write operation was masked.

7. The method of claim 6 wherein the second data comprises the compliment of the first data, and the third data comprises the compliment of the second data.

8. The method of claim 5, wherein any of the first data, the second data, and the third data stored at the addresses in the memory device comprises the sole storage component in the memory device providing an indication of which of the plurality of addresses may include a defect.

9. The method of claim 5 wherein the first data written to the addresses in the memory device comprises the same data written to each of the addresses.

10. The method of claim 9 wherein the first data written to the addresses in the memory device comprises a plurality of data bits written to each address, wherein all of the plurality of data bits have the same value.

11. The method of claim 5 wherein the second data comprises a compliment of the first data.

12. The method of claim 5 wherein determining whether the first data was correctly stored at the address comprises determining if every bit of the read data have a same value.

13. The method of claim 5 wherein the act of determining whether the first data was correctly stored at the address comprises:
   dividing the data into a plurality of subsets of data; and
   determining if all of the bits within each subset have the same value.

14. The method of claim 5 wherein the act of determining whether the first data was correctly stored at the address comprises:
   providing a bit having a particular value;
   dividing the data into a plurality of subsets of data; and
   comparing all of the bits within each subset to the provided bit to determine if each of the bits within each subset have the particular value.

15. The method of claim 5, wherein the second data comprises at least one bit that is a compliment of a bit of the first data.

16. A system for testing an array of memory cells, comprising:
   error detect circuitry configured to determine whether data read from the array of memory cells are in error and to generate an error signal responsive to detecting a read data error; and
   a write mask circuit coupled to receive the error signal from the error detect circuitry, the write mask circuit being configured to generate a write mask signal responsive to receiving the error signal indicating that the data read from the array of memory cells is in error.

17. The system of claim 16, further comprising a logic circuit configured to receive the write mask signal and an external write mask signal, the logic circuit further configured to generate a final write mask signal responsive to receiving either the write mask signal or the external write mask signal.

18. The system of claim 16, wherein the write mask circuit comprises a latch configured to be in one of a first state or a second state, the latch being configured to generate the write mask signal in the second state.

19. The system of claim 18, further comprising a reset circuit configured to set the latch in the first state responsive to receiving a reset signal.

20. The system of claim 19, wherein the reset circuit is configured to generate the reset signal responsive to receiving both of a first signal indicative of a specific memory operation and a second signal indicative of a specific test mode being selected.

21. The system of claim 20 wherein logic circuit is configured to inhibit a final write mask signal from being generated responsive to receiving an active external write mask signal when the second signal is received.

22. A memory device, comprising:
   an array of memory cells;
   an addressing circuit coupled to the array of memory cells;
   a command decoder coupled to the array of memory cells;
   a data path coupling the array of memory cells and a plurality of data bus terminals;
   error detect circuitry coupled to the data path and being configured to determine whether data read from the array of memory cells are in error and to generate an error signal responsive to detecting a read data error; and
   a write mask circuit coupled to the data path and being configured to receive the error signal from the error detect circuitry, the write mask circuit being configured to mask write data from being coupled to the array of memory cells responsive to receiving the error signal indicating that the data read from the array of memory cells is in error.

23. The system of claim 22 wherein the write mask circuit comprises a latch configured to be in one of a first state or a second state, the latch being placed in the second state responsive to the error signal, the latch being configured to generate the write mask signal in the second state.

24. The memory device of claim 23 wherein the command decoder is configured to generate a read signal responsive to decoding a read command, and wherein the latch is placed in the first state responsive to receiving the read signal from the command decoder.

25. The memory device of claim 22 wherein the memory device is configured to read data from the array of memory cells and write data to the array of memory cells responsive to both a rising edge of a clock signal and a falling edge of the clock signal, and wherein the error detect circuitry is configured to determine whether data read from the array of memory cells responsive to both the rising edge and the falling edges of the clock signal are in error, to generate a first error signal responsive to detecting an error in data read from the array of memory cells responsive to the rising edge of the clock signal, and to generate a second error signal responsive to detecting an error in data read from the array of memory cells responsive to the falling edge of the clock signal.

26. The memory device of claim 25 wherein the write mask circuit further comprises:
   a first latch configured to be in one of a first state or a second state, the first latch being placed in the second state responsive to the first error signal, the latch being configured to generate a first signal in the second state;
   a second latch configured to be in one of a first state or a second state, the second latch being placed in the second state responsive to the second error signal, the latch being configured to generate a second signal in the second state; and
   a logic circuit coupled to receive the first signal and the second signals from the first latch and the second latch, respectively, the logic circuit being configured to mask write data from being coupled to the array of memory cells responsive to receiving one of the first signal or the second signal.

27. The memory device of claim 22 wherein the write mask circuit comprises a logic circuit receiving an external write mask signal, the logic circuit being configured to mask write data from being coupled to the array of memory cells responsive to the external write mask signal.

28. The memory device of claim 22 wherein the command decoder comprises a mode register configured to be programmed to selectively enable or disable the write mask circuit from masking write data from being coupled to the array of memory cells responsive to receiving the error signal.

* * * * *

UNITED STATES PATENT AND TRADEMARK OFFICE
CERTIFICATE OF CORRECTION

| | | |
|---|---|---|
| PATENT NO. | : 8,429,470 B2 | Page 1 of 1 |
| APPLICATION NO. | : 12/721346 | |
| DATED | : April 23, 2013 | |
| INVENTOR(S) | : Michael A. Shore | |

It is certified that error appears in the above-identified patent and that said Letters Patent is hereby corrected as shown below:

In the Claims:

In column 7, line 62, in Claim 1, delete "react" and insert -- read --, therefor.

In column 9, line 60, in Claim 21, delete "wherein" and insert -- wherein the --, therefor.

In column 10, line 16, in Claim 23, delete "system" and insert -- memory device --, therefor.

In column 10, line 33, in Claim 25, delete "edges" and insert -- edge --, therefor.

In column 10, line 51, in Claim 26, delete "signals" and insert -- signal --, therefor.

Signed and Sealed this
Twenty-fifth Day of June, 2013

Teresa Stanek Rea
*Acting Director of the United States Patent and Trademark Office*